(12) United States Patent
Delabie et al.

(10) Patent No.: US 10,056,253 B2
(45) Date of Patent: Aug. 21, 2018

(54) METHOD FOR FORMING A VERTICAL HETERO-STACK AND A DEVICE INCLUDING A VERTICAL HETERO-STACK

(71) Applicant: IMEC VZW, Leuven (BE)

(72) Inventors: Annelies Delabie, Bierbeek (BE); Silvia Armini, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/616,198

(22) Filed: Jun. 7, 2017

(65) Prior Publication Data

US 2017/0352766 A1 Dec. 7, 2017

(30) Foreign Application Priority Data

Jun. 7, 2016 (EP) ..................................... 16173384

(51) Int. Cl.
*H01L 21/02* (2006.01)
*H01L 29/786* (2006.01)
(Continued)

(52) U.S. Cl.
CPC .... *H01L 21/02568* (2013.01); *H01L 21/0262* (2013.01); *H01L 21/02603* (2013.01);
(Continued)

(58) Field of Classification Search
CPC ......... H01L 29/78696; H01L 21/02568; H01L 21/0262; H01L 21/02639; H01L 21/02642;
(Continued)

(56) References Cited

U.S. PATENT DOCUMENTS 8,916,914 B2 12/2014 Kim et al.
2006/0073681 A1* 4/2006 Han ....................... B82Y 10/00
438/479
(Continued)

FOREIGN PATENT DOCUMENTS

WO 2015/142358 A1 9/2015

OTHER PUBLICATIONS

European Search Report, European Patent Application No. 16173384.5, dated Dec. 15, 2016, 6 pages.

*Primary Examiner* — Fei Fei Yeung Lopez
(74) *Attorney, Agent, or Firm* — McDonnell Boehnen Hulbert & Berghoff LLP

(57) ABSTRACT

Embodiments described herein include a method for forming a vertical hetero-stack and a device including a vertical hetero-stack. An example method is used to form a vertical hetero-stack of a first nanostructure and a second nanostructure arranged on an upper surface of the first nanostructure. The first nanostructure is formed by a first transition metal dichalcogenide, TMDC, material and the second nanostructure is formed by a second TMDC material. The example method includes providing the first nanostructure on a substrate. The method also includes forming a reactive layer of molecules on the first nanostructure along a periphery of the upper surface. The method further includes forming the second nanostructure by a vapor deposition process. The second TMDC material nucleates on the reactive layer of molecules along the periphery and grows laterally therefrom to form the second nanostructure on the upper surface.

20 Claims, 4 Drawing Sheets

(51) Int. Cl.
   *H01L 29/66*      (2006.01)
   *H01L 21/441*     (2006.01)
   *H01L 29/24*      (2006.01)

(52) U.S. Cl.
   CPC .. *H01L 21/02639* (2013.01); *H01L 21/02642* (2013.01); *H01L 21/02645* (2013.01); *H01L 21/441* (2013.01); *H01L 29/24* (2013.01); *H01L 29/66969* (2013.01); *H01L 29/78696* (2013.01)

(58) Field of Classification Search
   CPC . H01L 21/02645; H01L 21/441; H01L 29/24; H01L 29/66969
   See application file for complete search history.

(56) References Cited

U.S. PATENT DOCUMENTS

| | | |
|---|---|---|
| 2012/0286244 A1 | 11/2012 | Chiu et al. |
| 2014/0197459 A1 | 7/2014 | Kis et al. |
| 2014/0332814 A1* | 11/2014 | Peng .................. H01L 21/0262 257/49 |
| 2015/0014630 A1* | 1/2015 | Choi .................. H01L 29/1606 257/24 |
| 2015/0318401 A1 | 11/2015 | Duan et al. |

* cited by examiner

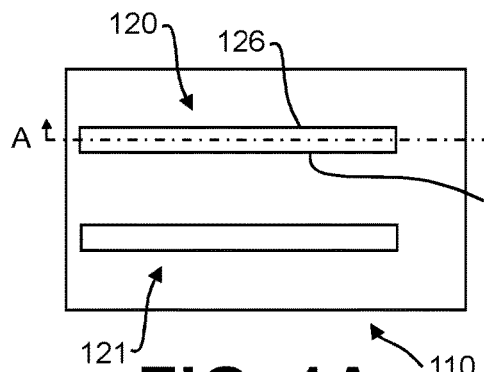
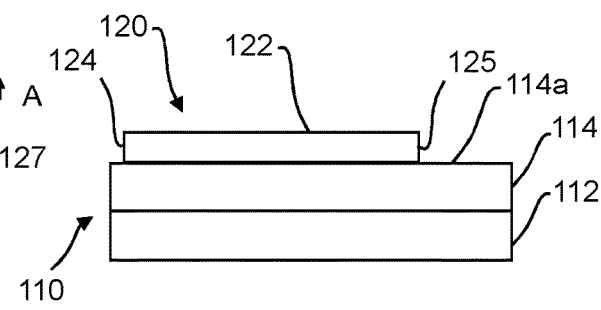
FIG. 1A          FIG. 1B
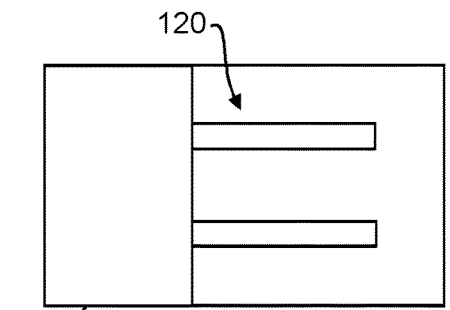
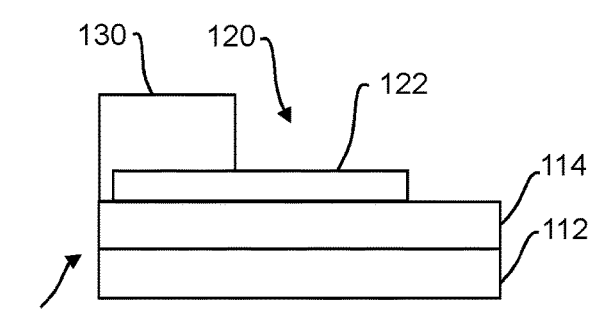
FIG. 1C          FIG. 1D
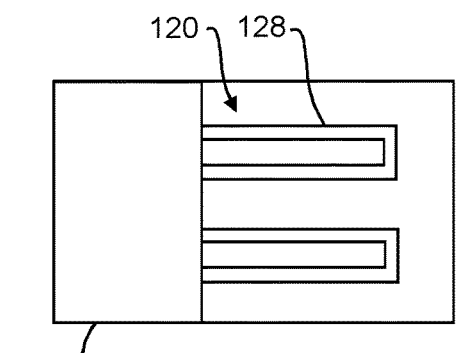
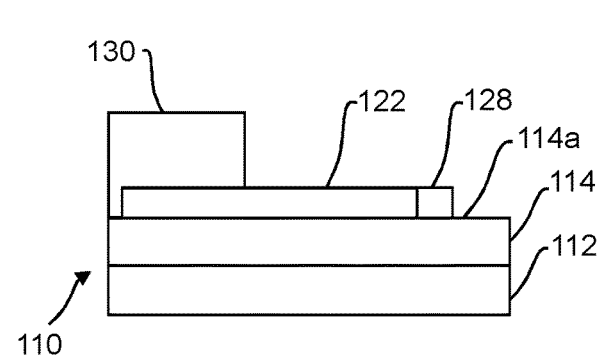
FIG. 1E          FIG. 1F

METHOD FOR FORMING A VERTICAL HETERO-STACK AND A DEVICE INCLUDING A VERTICAL HETERO-STACK

CROSS-REFERENCE TO RELATED APPLICATIONS

The present application is a non-provisional patent application claiming priority to European Patent Application No. EP 16173384.5, filed Jun. 7, 2016, the contents of which are hereby incorporated by reference.

FIELD OF THE DISCLOSURE

The present disclosure relates to a method for forming a vertical hetero-stack. The disclosure also relates to a device including a vertical hetero-stack.

BACKGROUND

Over the last few decades, the dimensions of electronic devices have been continuously scaled down, leading to exponential gains in computational power and reduced production costs. The down-scaling has been enabled inter alia by advances in patterning techniques based on for instance optical lithography.

To further improve the performance of electronic devices, potential materials for device fabrication are being investigated. One type of material of great interest is transition metal dichalcogenide (TMDC) materials. A TMDC material may be formed by a stack of monolayers of the TMDC material. The monolayers typically present a strong in-plane bonding (i.e. within a basal plane) but weak interlayer attraction due to van der Waals interactions.

A hetero-stack of two different TMDC materials could form the basis for devices presenting band-to-band-tunneling, a high $I_{on}/I_{off}$ ratio and lower power consumption. For instance, a tunneling field effect transistor (TFET) including a vertical hetero-stack of TMDC materials shows promise as a replacement for the conventional metal-oxide-semiconductor field-effect transistors (MOSFETS).

Although techniques for forming proof-of-concept TMDC hetero-stack devices have been presented, challenges remain to be overcome before large-scale production of such devices becomes feasible.

SUMMARY

A major challenge for efficient, reliable and repeatable production of vertical TMDC hetero-stacks relates to forming two nanostructures of different TMDC materials to be aligned in an accurate and repeatable manner.

Embodiments described herein may provide a method for forming a vertical hetero-stack of a first and a second TMDC material, which overcomes or at least facilitates the above identified challenge. Further features may be understood from the following. A further feature is to provide a device including a vertical TMDC hetero-stack.

According to a first aspect, there is provided a method for forming a vertical hetero-stack of a first nanostructure and a second nanostructure arranged on an upper surface of the first nanostructure, the first nanostructure formed by a first TMDC material and the second nanostructure formed by a second TMDC material. The method comprises:

providing the first nanostructure on a substrate wherein the upper surface of the first nanostructure is formed by a basal plane of the first TMDC material, forming a reactive layer of molecules on the first nanostructure along a periphery of the upper surface, and forming the second nanostructure by a vapor deposition process wherein the second TMDC material nucleates on the reactive layer of molecules, along the periphery and grows laterally therefrom to form the second nanostructure on the upper surface.

The method may enable the second nanostructure to be formed by vapor deposition of the second TMDC material, selectively on the first nanostructure. In particular, the method enables the second nanostructure to be formed by a monolayer of the second TMDC material.

The reactive layer may be referred to as a reactive agent (with respect to or for the vapor deposition process).

The reactive layer enables nucleation of the second TMDC material along the periphery of the upper surface of the first nanostructure. The periphery of the upper surface is formed by the outer edges of the upper surface.

As a basal plane of a TMDC material generally presents a comparably low out-of-plane reactivity, the second TMDC material may strongly favor nucleating on the reactive layer formed along the periphery of the basal plane over nucleating directly on the upper surface of the first nanostructure. The reactive layer may accordingly be selected to be more chemically reactive with respect to the deposition process than the basal plane of the first TMDC material.

By the lateral growth of the second TMDC material, the second TMDC material may grow along the upper surface of the first nanostructure (or in other words above and in parallel to the upper surface) such that the second nanostructure is formed to overlap the first nanostructure. Thus an interface may be formed between the first TMDC material and the second TMDC material. This in turn enables manufacture of devices presenting band-to-band-tunneling, such as TFETs.

By the selective deposition of the second TMDC material, the second nanostructure may be formed in a self-aligned manner in relation to the first nanostructure. This obviates or at least reduces the need for subsequent patterning of the second TMDC material after the vapor deposition process (hereinafter referred to as the deposition process). Exposure of the first/second nanostructure to processes and chemicals which potentially could affect the structure and properties of the first/second TMDC materials (e.g. introducing dangling bonds or impurities/residues, or causing oxidation at the crystal edges and/or basal plane) may hence be avoided or at least reduced.

The basal plane forming the upper surface of the first nanostructure may act as a template for epitaxial alignment of the second TMDC during the lateral growth thereof. Although the growth of the second TMDC material occurs from the crystal edges of the second TMDC material, the crystal lattice of the basal plane of the first TMDC material may influence the orientation of the crystal lattice second TMDC material.

Some embodiments may enable a formation of a sharp/abrupt and relatively defect-free interface between the first and the second TMDC material.

In some embodiments, the second nanostructure may be formed directly on the upper surface of the first nanostructure, i.e. with no intermediate layers in-between.

In the context of the present application, a "lateral" growth is to be construed as a growth within a plane which is parallel, or at least substantially parallel, to the upper surface of the first nanostructure. With reference to the main surface of the substrate, a lateral growth may also be referred to as a horizontal growth.

A "vertical" hetero-stack implies the stacking direction of the first and the second nanostructures in relation to the substrate. Accordingly, with respect to the normal direction of the main surface of the substrate, the first nanostructure may be said to be arranged below the second nanostructure in the overlapping region. Likewise, the second nanostructure may be said to be arranged above the first nanostructure in the overlapping region.

In the present context, the term "TMDC material" refers to a transition metal dichalcogenide material of one monolayer or a stack of monolayers, each monolayer formed by a single layer of transition metal atoms/elements M sandwiched between two layers of chalcogen atoms/elements X. A TMDC material may be described by the formula $MX_2$. A TMDC material may present a poly-crystalline or a mono-crystalline form. The transition metal element M of a TMDC material may be tungsten (W), molybdenum (Mo), hafnium (Hf), or zirconium (Zr). The chalcogen element X of a TMDC material may be selenium (Se), sulfur (S), or tellurium (Te).

Accordingly, the first TMDC material and the second TMDC material may be selected as a combination of two different materials from the group consisting of: $WSe_2$, $WS_2$, $WTe_2$, $MoS_2$, $MoSe_2$, $MoTe_2$, $HfS_2$, $HfSe_2$, $Hfe_2$, $ZrS_2$, $ZrSe_2$, $ZrTe_2$. The first TMDC material may be formed by one monolayer or a stack of monolayers of the first TMDC material. The second TMDC material may be formed by one monolayer or a stack of monolayers of the second TMDC material. With a thickness of 1-10 monolayers, the first/second nanostructure may behave strictly (i.e. in the case of a thickness of a single monolayer) or at least substantially (i.e. in the case of a thickness of a few monolayers) as a 2-dimensional (2D) material.

Various shapes and dimensions of the first nanostructure are envisaged. The first nanostructure may, in addition to the upper surface, have at least one side surface. The first nanostructure may have a first pair of side surfaces on opposite sides thereof and a second pair of side surfaces on opposite sides thereof. The side surfaces may be formed by the outer edges of the crystal lattice of the first TMDC material.

The first nanostructure may be an elongated nanostructure extending along, i.e. in parallel to, a main surface of the substrate. The first nanostructure may have a first pair of side surfaces forming end surfaces of the first nanostructure and a second pair of side surfaces extending along opposite sides of the first nanostructure, between the end surfaces.

According to one embodiment, the second nanostructure is formed as a single monolayer of the second TMDC material. Subsequent to the second TMDC material nucleating along the periphery of the upper surface of the first nanostructure, the lateral growth may result by a lateral deposition of the second TMDC material on crystal edges of the single monolayer of the already deposited second TMDC material.

As discussed above, a basal plane of a TMDC material generally presents a comparably low reactivity. Thus, the deposition process may be reliably controlled such that the second TMDC material (following the nucleation on the reactive layer) favors growing laterally on the crystal edges of the second TMDC material over growing vertically on the upper surface of the first or the second TMDC material (e.g. by van der Waal bonding).

Since van der Waal epitaxy (which in this context may be considered to represent a competing growth mechanism) includes comparably high reaction energies (such as higher temperature and/or higher partial precursor pressures) vertical growth of the second TMDC material may prevented or at least counteracted by controlling the process conditions. Pure single monolayer growth of the second TMDC material may thus be achieved.

According to one embodiment the method further comprises, prior to forming the second nanostructure, forming a dielectric layer on the substrate adjacent to the first nanostructure by a dielectric layer deposition process, the dielectric layer being formed with a thickness corresponding to a thickness of the first nanostructure.

With the dielectric layer present during the deposition process of the second TMDC material, the second TMDC material may grow laterally both above and along the upper surface of the first nanostructure as well as above and along an upper surface of the dielectric layer.

The dielectric layer may act as a support for a protruding portion of the second nanostructure. Mechanical stress or deformation induced by bending forces acting on the protruding portion of the second nanostructure may thereby be avoided or at least reduced.

By the thickness of the dielectric layer corresponding to the thickness of the first nanostructure lateral (outward) growth of the second TMDC material from surface portions of the reactive layer at a level below the upper surface of the first nanostructure is prevented, while a lateral growth of the second TMDC material from an upper edge portion of the reactive layer along the upper surface of the first nanostructure is allowed.

Especially, the dielectric layer may be formed with a thickness such that an upper surface of the dielectric layer becomes flush with the upper surface of the first nanostructure.

The dielectric layer may be formed by depositing a material which is inert with respect to the deposition process for the second TMDC material.

The dielectric layer may be formed by depositing a dielectric material on the substrate. The dielectric material may be deposited in a selective area deposition process. A main surface of the substrate (e.g. formed by an uppermost sub-layer of the substrate) may be formed by a dielectric sub-layer. A dielectric layer may be formed selectively on the exposed regions of the main surface of the substrate by deposition of the dielectric material (e.g. by atomic layer deposition (ALD) using $H_2O$ as a precursor). The dielectric material may be a high-K dielectric. A high-K dielectric may present a low tendency to nucleate on the basal plane of a TMDC material. Thus, the high-K dielectric material may be deposited in a highly selective manner on regions of the substrate not covered by the first nanostructure, while avoiding deposition of high-K material on the first nanostructure.

According to one embodiment, each molecule of the reactive layer of molecules includes a head group bonding to the first nanostructure and a tail group forming a reactive site for a precursor of the deposition process of the second TMDC material.

The head group may be selected to passivate the surface regions of the first nanostructure to which the head group becomes bonded. Dangling or unsaturated bonds which may be present on the crystal edges of the first nanostructure and which otherwise could lead to undesirable and/or unpredictable changes of the electronic properties in the hetero-stack may thereby be passivated.

The tail group may be selected to be more chemically reactive with respect to a precursor of the deposition process of the second TMDC material than the upper surface of the first TMDC material.

Each molecule may further include a spacer group connecting the head group to the tail group. Each molecule may accordingly consist of a head group, a spacer group, and a tail group.

If the above-mentioned dielectric layer deposition process is performed, the dielectric layer may be formed to expose the tail groups of the molecules at an upper edge of the monolayer of molecules. The dielectric layer may cover tail groups of molecules below the upper edge, wherein exposure of the covered tail groups to precursors of the deposition process is prevented.

The reactive layer may be formed by a self-assembled monolayer of molecules.

Each molecule of the reactive layer may include one of a thiol head group or a selenol head group in combination with one of a thiol tail group, a hydroxy tail group or a carboxyl tail group. A thiol head group or a selenol head group may bond to the first TMDC material forming the first nanostructure. A thiol, hydroxy, or carboxyl tail group may provide a reactive site for a precursor of the deposition process of the second TMDC material.

The reactive layer may be formed on at least one side surface of the first nanostructure. Since the upper surface of the first nanostructure is formed by a basal plane of the first TMDC material selective formation of the reactive layer on a side surface of the first nanostructure may be readily achieved.

An upper edge of the reactive layer of molecules may be formed to be flush, or at least substantially flush with the upper surface of the first nanostructure, wherein the tail groups of the molecules of the reactive layer at the upper edge may react with a precursor of the deposition process of the second TMDC material.

According to one embodiment the method further comprises:

prior to forming the dielectric layer on the substrate adjacent to the first nanostructure, forming a process layer of molecules on the first nanostructure along the periphery of the upper surface, each molecule of the process layer of molecules including a head group bonding to the first nanostructure and a tail group being inert with respect to the dielectric layer deposition process, and subsequent to forming the dielectric layer, removing the process layer wherein a trench is formed between the dielectric layer and the first nanostructure, along the periphery of the upper surface, and forming the reactive layer of molecules on the first nanostructure along the periphery in the trench.

The forming and removing of the process layer enables formation of a space or gap between the dielectric layer and the first nanostructure which may accommodate the reactive layer of molecules. Exposure of the reactive layer to the dielectric layer deposition process may thereby be avoided.

The tail group may be selected as a heterophobic group. A heterophobic tail group may facilitate selective deposition of the dielectric layer on the substrate while avoiding bonding to the process layer, especially if the dielectric layer deposition process includes a $H_2O$ precursor.

Each molecule of the process layer may further include a spacer group connecting the head group to the tail group. Each molecule may accordingly consist of a head group, a spacer group, and a tail group.

The process layer may be formed by a self-assembled monolayer.

Each molecule of the process layer may include one of a thiol head group or a selenol head group, and one of a hydrocarbon tail group, an organofluorine tail group, or a cyano-alkane tail group. More specifically, a hydrocarbon tail group may be formed by an alkane tail group. An organofluorine tail group may be formed by a trifluoromethyl tail group. A thiol head group or a selenol head group may bond to the first TMDC material forming the first nanostructure. Hydrocarbon, organofluorine, or cyano-alkane tail groups may be selected to present a low reactivity with respect to the dielectric layer deposition process.

The process layer may be removed by a heating process. The heating process may heat the process layer to a temperature causing desorption of the molecules forming the process layer. The process layer may alternatively be removed by a plasma-based etch process.

A chain length of the molecules forming the process layer may be greater than a chain length of the molecules forming the reactive layer. This may facilitate forming of the reactive layer in the trench by ensuring that the width of the trench is sufficient for accommodating the full length of the molecules forming the reactive layer.

According to one embodiment the method further comprises:

prior to forming the dielectric layer on the substrate adjacent to the first nanostructure, forming a process layer of molecules on the first nanostructure along the periphery of the upper surface, each molecule of the process layer of molecules including a head group bonding to the first nanostructure and a tail group being inert with respect to the dielectric layer deposition process, and subsequent to forming the dielectric layer, converting the process layer into the reactive layer of molecules by activating the tail group of the molecules of the process layer with respect to a precursor of the deposition process of the second TMDC material.

Exposure of the reactive (with respect to the deposition process of the second TMDC material) tail group of the reactive layer to the dielectric layer deposition process may thereby be avoided.

The process layer may be formed by a self-assembled monolayer.

Each molecule of the process layer may include one of a thiol head group or a selenol head group, and a cyano-alkane tail group. A thiol head group or a selenol head group may bond to the first TMDC material forming the first nanostructure. A cyano-alkane tail group may be activated by subjecting the process layer to UV radiation. A cyano-alkane tail group may be converted into a hydroxy or carboxyl tail group.

The deposition process of the second TMDC material may include controlling a deposition rate of at least one precursor of the deposition process and/or a presence of a co-reagent and/or a process temperature such that nucleation of the second TMDC material on the upper surface of the first nanostructure is prevented (or at least counteracted) while nucleation of the second TMDC material on the reactive layer and lateral growth of the second TMDC material on crystal edges of already deposited second TMDC material is allowed.

The deposition process for forming the second nanostructure may be a chemical vapor deposition (CVD) process (pulsed or continuous) or an ALD process.

The deposition process may include exposing the first nanostructure with the reactive layer formed thereon to a first precursor including a transition metal source and a second precursor including a chalcogen source.

The first precursor may include a compound of a transition metal element and a fluoride or chloride. The second precursor may include a compound of a chalcogen element and hydrogen ($H_2$).

The transition metal of the first precursor may be W, Mo, Hf, or Zr. The chalcogen of the second precursor may be Se, S, or Te.

According to one embodiment the second TMDC material, during the deposition process, grows laterally in a first lateral direction along the upper surface of the second portion of the first nanostructure and in a second lateral direction away from the first nanostructure to form a protruding portion of the second nanostructure. The protruding portion may protrude from the first nanostructure, above a region of the substrate adjacent to the first nanostructure. Forming the second nanostructure with a protruding portion may facilitate device manufacture, as further described below.

According to one embodiment the method further comprises forming a mask on the first nanostructure, wherein the mask covering a first portion of the first nanostructure and exposing a second portion of the first nanostructure, wherein during the deposition process the mask prevents formation of the second nanostructure on the upper surface of the first portion of the first nanostructure. Thus, the mask may prevent lateral growth of the second TMDC material along the upper surface of the first portion.

By defining dimensions of the mask, the dimensions of the overlap or interface between the first and the second structure may be readily and accurately controlled. Consequently, the surface area of the tunneling interface in a finished device may be controlled as desired in a rational and repeatable manner. Compared to prior-art exfoliation-based techniques, involving transfer of an exfoliated second nanostructure onto a substrate having a first nanostructure, the method enables a greater degree of control and repeatability with respect to the alignment between the first and second nanostructures to be achieved.

Moreover since the first portion of the first nanostructure will not be covered by the second nanostructure, contacting of the first nanostructure with an electrode (e.g. a source or drain electrode) independently from the second nanostructure is facilitated (i.e. following mask removal).

The mask may be formed to cover the upper surface and side surfaces of the first portion of the first nanostructure. The mask may be formed to expose the upper surface and side surfaces of the second portion of the first nanostructure.

The mask may be formed by depositing a masking layer on the substrate and the first nanostructure and patterning the masking layer to remove the masking layer from the second portion of the first nanostructure while keeping the masking layer on the first portion of the first nanostructure.

The second nanostructure may be formed to completely cover the upper surface of the second portion of the first nanostructure.

The mask may be removed subsequent to forming the second nanostructure. The first portion of the first nanostructure may thereby be exposed.

The mask may be formed prior to forming the process layer or at least prior to forming the reactive layer, wherein the mask prevents forming of the reactive layer on the first portion of the first nanostructure.

The reactive layer may thereby be selectively formed on the second portion of the first nanostructure.

Alternatively, the mask may be formed subsequent to forming the reactive layer on the first nanostructure. The mask may cover the first portion of the first nanostructure and any reactive layer present on the first portion. The mask may prevent nucleation of the second TMDC material along a periphery of the upper surface of the first portion of the first nanostructure.

According to one embodiment the reactive layer is formed to extend at least along a part of the periphery of the portion of the upper surface being exposed by the mask. The second TMDC material may thus be grown along the part of the periphery exposed by the mask. The part of the periphery may be formed by an upper edge of an end surface of the second portion of the first nanostructure. As will be further described below, this enables forming of the second nanostructure with a portion protruding at least beyond and end surface of the first nanostructure.

In some embodiments, the reactive layer is formed to extend at least along the entire part of the periphery of the portion of the upper surface being exposed by the mask. The second TMDC material may thus be grown along the entire periphery exposed by the mask wherein the time for covering the exposed upper surface of the first nanostructure may be reduced.

According to one embodiment the second TMDC material, during the deposition process, is grown laterally to form a first portion of the second nanostructure overlapping the second portion of the first nanostructure and to form a second portion of the second nanostructure protruding beyond the periphery of the upper surface of the second portion of the first nanostructure. Thereby, a hetero-stack of a first and a second nanostructure may be formed wherein the second nanostructure is formed to be displaced in relation to the first nanostructure. A "staggered" hetero-stack of the first and second nanostructure may thereby be formed. Such a hetero-stack may lend itself for TFET device manufacture.

The second portion of the first nanostructure and the first portion of the second nanostructure form an overlapping region of the hetero-stack. The second (protruding) portion of the second nanostructure may protrude above a region of the substrate adjacent to the first nanostructure (and the dielectric layer if such is present). The second portion of the second nanostructure may protrude beyond the periphery of the upper surface of the second portion, along three outer edges thereof. If the first nanostructure forms an elongated nanostructure, the second nanostructure may protrude beyond the first nanostructure in the longitudinal direction thereof.

According to one embodiment the method further comprises forming a gate stack on an upper surface of the second nanostructure above a region of overlap between the second nanostructure and the first nanostructure. The gate stack may include a gate dielectric formed directly on the upper surface of the second nanostructure. The gate stack may include a gate conductor formed on the dielectric layer.

The gate stack may be formed prior to removing the mask. This may simplify the overall process since the mask thereby may be reused for the purpose of preventing forming of the gate stack on the first portion of the first nanostructure.

The method may further comprise forming a source or drain electrode in contact with the first portion of the first nanostructure and/or forming a drain or source electrode in contact with the second nanostructure. In some embodiments, the drain or source electrode is formed in contact with a protruding portion of the second nanostructure. The source and/or drain electrode may be formed subsequent to removing the mask.

The substrate on which the first nanostructure is provided in accordance with the first aspect may be semiconductor-including substrate.

The substrate may be formed by a single layer of a semiconductor material. The substrate may also be formed by a stack of substrate sub-layers. A semiconductor sub-layer may be formed on an insulator sub-layer. The stack may include a buffer sub-layer formed on the substrate sub-layer. The buffer sub-layer may protect underlying sub-layers of the substrate from the processing steps associated with the forming of the hetero-stack. The buffer layer may be formed by a dielectric material. The buffer layer may be formed by a high-K dielectric material.

According to one embodiment, providing the first nanostructure on the substrate comprises:

forming a nanostructure of a sacrificial material on the substrate; and forming the first nanostructure on the substrate by a first deposition process during which the feature of the sacrificial material is removed from the substrate by forming a volatile reaction product with a precursor of the first deposition process, wherein the sacrificial material is replaced by the first TMDC material and the first TMDC material is selectively deposited on surface portions of the substrate, which portions were covered by the feature of the sacrificial material, to form the first nanostructure of the first TMDC material.

In accordance with this embodiment, the deposition process for forming the second nanostructure disclosed above may be referred to as a "second" deposition process which is different from the "first" deposition process for forming the first nanostructure.

According to this embodiment the first nanostructure may be formed by a selective deposition process. The position and dimensions of the "sacrificial" nanostructure of the sacrificial material (i.e. a pattern in a sacrificial layer) may be transferred to the first TMDC material. Thereby materials which otherwise may be challenging or not possible to process using conventional lithography and etching (e.g. due to not forming volatile compounds with the etchants) may be formed at desired positions and with desired dimensions by using the sacrificial nanostructure as an intermediary or template.

Patterning nanostructures of TMDC layers by conventional lithography and etching methods may involve combinations of etchants in different cycles due to the structure of the TMDC material. Moreover, nanostructures of TMDC materials made by conventional patterning and etching techniques may present unpassivated edges (unsaturated/"dangling" metal bonds, chalcogen-vacancies) or include impurities/residues from the etch process. The structure of the TMDC crystal edges and the edge termination and the passivation of edge atoms can alter the electronic properties of TMDC nanostructures and make them prone to oxidation. Forming the first nanostructure in accordance with the present embodiment avoids or at least reduces these issues since the first TMDC material may be deposited directly as a first nanostructure of the desired shape.

The sacrificial material may include a sacrificial element acting as a co-reagent in a reaction with the precursor of the first deposition process. The presence of the sacrificial material may accordingly be a condition for the reaction with the precursor, wherein it follows that the amount of the sacrificial element, determined inter alia by the dimensions of the sacrificial nanostructure, controls the final dimensions of the first nanostructure of the first TMDC material, at least partially. Thus, the dimensions of the sacrificial nanostructure affect the position as well as the longitudinal, lateral and thickness dimensions of the first nanostructure.

The co-reagent may function as a reducing agent or participate in a ligand exchange reaction.

According to one embodiment the first deposition process includes exposing the substrate, with the sacrificial nanostructure formed thereon, to a first precursor and a second precursor, the first precursor includes a compound of a transition metal element M and a first reaction element, the sacrificial material includes a sacrificial element acting as a co-reagent in a reaction with the first precursor and forming a volatile reaction product with the first reaction element wherein the transition metal element M is deposited on the substrate; and the second precursor includes a compound of a chalcogen element X, and a second reaction element wherein the second target element reacts with the transition metal element M deposited on the substrate to form the first TMDC material and the second reaction element forms a volatile reaction product.

Thereby, a sacrificial nanostructure of a sacrificial material may be replaced by the first nanostructure of the first TMDC material.

The transition metal element of the first precursor may be W or Mo. The first reaction element may be fluoride or chloride.

The chalcogen element of the second precursor may be Se, S, or Te. The second reaction element may be hydrogen ($H_2$).

According to an example embodiment, the first precursor of the first deposition process may be selected from the group consisting of: $WF_6$, $MoCl_3$, $MoCl_4$, $MoCl_5$, $WCl_4$, $WCl_5$, $WCl_6$, $WO_2Cl_2$. The second precursor of the first deposition process may be selected from the group consisting of: $H_2S$, $H_2Se$, $H_2Te$.

According to one embodiment, forming the sacrificial nanostructure on the substrate includes forming a sacrificial material layer on the substrate and patterning the sacrificial material layer using a lithography and etching process. The sacrificial layer may thus be patterned using conventional and readily available patterning processes. In some embodiments, the sacrificial layer may be formed to include a number of monolayers of the sacrificial element, such as a number in the range of 1-10.

The sacrificial material may be Si, Al, Ti, TiN, Hf, Sn, Zr, or Ta. Each of these materials has the ability to form a volatile reaction product with both chloride- and fluoride-based precursors. Processes for deposition and patterning of layers of these materials are also accurate and reliable.

According to one embodiment the substrate is formed by a stack including a substrate sub-layer and a template sub-layer formed on the substrate layer, wherein the sacrificial nanostructure is formed on the template sub-layer. If a buffer sub-layer is present on the substrate sub-layer as described above, the template sub-layer may be formed on the buffer sub-layer.

The template may sub-layer enables an improved control over the orientation of the growth fronts of the target material during the first deposition process.

The template layer may be formed such that there is a crystallographic relationship between the crystal structure of the material forming the template layer and the crystal structure of first TMDC material forming the first nanostructure. The template layer may be formed by sapphire, GaN, AlN, Graphene, or a thin layer of a TMDC material which is different forming the material forming the first nanostructure.

According to a second aspect, there is provided a device including a vertical hetero-stack of a first TMDC material and a second TMDC material, the device comprising:

a first nanostructure of the first TMDC material, an upper surface of the first nanostructure being formed by a basal plane of the first TMDC material, a layer of molecules arranged on at least one side surface of the first nanostructure and extending along a periphery of the upper surface, and a second nanostructure of the second TMDC material arranged on the upper surface of the first nanostructure, the second nanostructure being displaced in relation to the first nanostructure to expose a first portion of the first nanostructure and to overlap a second portion of the first nanostructure, wherein a first portion of the second nanostructure is arranged to overlap the second portion of the first nanostructure and a second portion of the second nanostructure is arranged to protrude beyond the periphery of the upper surface of the first nanostructure.

Thus there is provided a device including a vertical hetero-stack of a first and a second TMDC material. A device structure enabling band-to-band-tunneling, a high $I_{on}/I_{off}$ ratio and lower power consumption is thus provided. In particular, the device enables a TFET having a vertical hetero-stack of two TMDC materials.

The above details discussed in connection to the first aspect apply correspondingly to the second aspect. In particular, the above details and discussion concerning the first nanostructure, the second nanostructure (such as their compositions, dimensions and reactive/electronic properties) apply correspondingly to the first and the second nanostructure referred to in the second aspect.

The first nanostructure may be formed by one monolayer or a stack of a few (e.g. 2-10) monolayers of the first TMDC material.

The second nanostructure may be formed by one monolayer or a stack of a few (e.g. 2-10) monolayers of the second TMDC material.

The molecules of the layer of molecules may each include a head group bonded to the at least one side surface of the first TMDC material and a tail group, the tail groups of the molecules forming an outer side surface of the layer. Each molecule may further include a spacer group connecting the head group to the tail group.

The presence of the layer of molecules on the first nanostructure enables passivation of the side surface regions of the first nanostructure on which the spacer layer is arranged. Dangling or unsaturated bonds which may be present on the crystal edges of the first nanostructure and which otherwise could lead to undesirable and/or unpredictable changes of the electronic properties in the hetero-stack may thereby be passivated, e.g. by forming bonds with the head groups.

The layer of molecules may be formed by a self-assembled monolayer of molecules.

Each molecule of the layer of molecules may include one of a thiol head group or a selenol head group in combination with one of a thiol tail group, a hydroxy tail group or a carboxyl tail group. A thiol head group or a selenol head group may bond to the first TMDC material forming the first nanostructure. A thiol, hydroxy or carboxyl tail group may bond to the second nanostructure (i.e. the second TMDC material forming the second nanostructure).

An upper edge of the layer of molecules may be flush with the upper surface of the first nanostructure, and wherein the tail groups of the molecules at the upper edge may be bonded to the second nanostructure.

According to one embodiment the device further comprises a substrate and a dielectric layer arranged on the substrate in a region adjacent to the first nanostructure, the dielectric layer having a thickness corresponding to a thickness of the first nanostructure. The second portion of the second nanostructure may protrude above the dielectric layer.

The dielectric layer may support the second portion of the second nanostructure.

An upper surface of the dielectric layer may be flush with the upper surface of the first nanostructure.

According to one embodiment the device further comprises a gate stack arranged on the first portion of the second nanostructure. The device may further comprise a first electrode arranged in contact with the first portion of the first nanostructure, and a second electrode arranged in contact with the second portion of the second nanostructure.

BRIEF DESCRIPTION OF THE DRAWINGS

The above, as well as additional features, will be better understood through the following illustrative and non-limiting detailed description of example embodiments, with reference to the appended drawings. In the drawings, like reference numerals will be used for like elements unless stated otherwise.

FIG. 1A schematically illustrates a portion of a method for forming a vertical hetero-stack, according to example embodiments.

FIG. 1B schematically illustrates a portion of a method for forming a hetero-stack, according to example embodiments.

FIG. 1C schematically illustrates a portion of a method for forming a hetero-stack, according to example embodiments.

FIG. 1D schematically illustrates a portion of a method for forming a hetero-stack, according to example embodiments.

FIG. 1E schematically illustrates a portion of a method for forming a hetero-stack, according to example embodiments.

FIG. 1F schematically illustrates a portion of a method for forming a hetero-stack, according to example embodiments.

DETAILED DESCRIPTION

A method for forming a vertical hetero-stack of a first TMDC material and a second TMDC material will now be described with reference to FIGS. 1A through 1P.

Figure 1G:
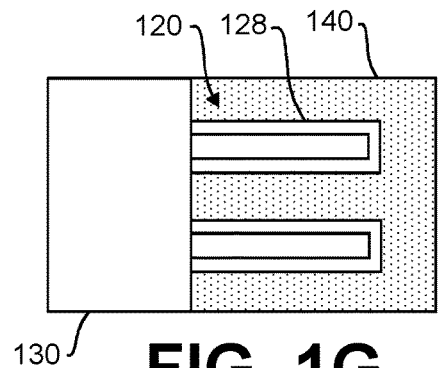
FIG. 1G schematically illustrates a portion of a method for forming a hetero-stack, according to example embodiments.

FIGS. 1A, 1C, 1E, 1G 1I, 1K, 1M, 1O are top-views of a substrate 110. FIGS. 1B, 1D, 1F, 1H, 1J, 1L, 1N, 1P each shows a cross-sectional view along the substrate 110 as indicated by the line A-A in FIG. 1A. FIGS. 1A-1P show only portions of the substrate 110 and the substrate 110 may extend horizontally/laterally beyond the illustrated portions.

According to the method a first nanostructure 120 is provided on the substrate 110. The first nanostructure is formed by a first TMDC material. As illustrated, a further first nanostructure 121 may be provided on the substrate 110. In the following, reference will only be made to the first nanostructure 120 however the following description applies correspondingly also to the first nanostructure 121. It may further be noted that more than the two first nanostructures 120, 121 may be provided on the substrate 110. Each such first nanostructure may be formed by the first TMDC material and be used to form a respective hetero-stack in accordance with the following method.

As shown in FIG. 1B the substrate 110 may include a stack of sub-layers which in a bottom-up direction includes a substrate sub-layer 112 and a buffer sub-layer 114. The substrate 110 may further be arranged on a (not shown) handling wafer. In that the case the substrate sub-layer 112 may be arranged between the handling wafer and the buffer sub-layer 114.

The substrate sub-layer 112 may be formed by a semi-conductor-including material. The substrate sub-layer 112 may be a silicon-based (Si) sub-layer such as a silicon on insulator (SOI) substrate. The substrate sub-layer 112 may also be a gallium arsenide (GaAs) substrate, a gallium arsenide phosphide (GaAsPh) substrate, an indium gallium arsenide (InGaAs) substrate, a silicon germanium (SiGe) substrate, a silicon on glass substrate, a silicon on sapphire substrate, or a germanium on insulator substrate.

The buffer sub-layer 114 may be formed by a layer of a dielectric material. The buffer sub-layer 114 may be formed by a silicon oxide such as $SiO_2$. The buffer sub-layer 114 may also be formed by a high-K dielectric material such as $Al_2O_3$, $Si_3N_4$, $HfO_2$, or $ZrO_2$.

The first nanostructure 120 is provided on a main surface of the substrate 110. For the illustrated substrate 110, the main surface is formed by the upper surface 114a of the buffer sub-layer 114. More generally, the main surface may be formed by the upper surface of the uppermost layer or sub-layer of the substrate.

The first nanostructure 120 presents an elongated shape. The first nanostructure 120 may be referred to as a lateral or horizontal nanowire. The first nanostructure 120 may be formed by one monolayer or a stack of a few monolayers of the first TMDC material. The first nanostructure 120 may present a width dimension and a thickness dimension (or equivalently a height dimension) of a few to tens of nanometers.

The first nanostructure 120 has an upper surface 122. The first nanostructure 120 is provided on the substrate 110 such that the upper surface 122 is formed by a basal plane of the first TMDC material.

The first nanostructure 120 further presents the side surfaces 124, 125. The side surfaces 124, 125 form respective end surfaces of the first nanostructure 120. The first nanostructure 120 further presents side surfaces 126, 127 extending along the first nanostructure 120 on opposite sides thereof. The side surfaces 124, 125, 126, 127 are formed by the crystal edges of the one or more monolayers of the first TMDC material forming the first nanostructure 120.

In FIG. 1C and FIG. 1D, a mask 130 has been formed on the first nanostructure 120. The mask 130 is formed to cover a first portion of the first nanostructure 120. The mask 130 covers the region of the upper surface 122 on the first portion of the first nanostructure 120. The mask 130 may also cover the regions of the side surfaces 124, 126, 127 on the first portion of the first nanostructure 120. The mask 130 exposes the region of the upper surface 122 on the second portion of the first nanostructure 120. The mask 130 also exposes the regions of the side surfaces 125, 126, 127 on the second portion of the first nanostructure 120.

As will be further described below, the mask 130 may be used for controlling a dimension of the overlap between the first nanostructure 120 and a second nanostructure 150. In the drawings, the mask 130 is shown to cover the first nanostructure 120 along roughly half the longitudinal dimension of the first nanostructure 120. However, the mask 130 may also be defined to cover a greater or smaller part of the first nanostructure 120.

The mask 130 may be formed by depositing a masking layer on the substrate 110 and the first nanostructure 120. The mask 130 may be defined by patterning the masking layer using a conventional lithography and etching process to remove the masking layer from the second portion of the first nanostructure 120 while keeping the masking layer on the first portion of the first nanostructure 120.

The mask 130 may be formed by $SiO_2$. The masking layer may be formed by depositing a layer of $SiO_2$ on a buffer sub-layer 114 of a high-K dielectric. The $SiO_2$ may be deposited in a plasma enhanced CVD process. The undesired portions of the $SiO_2$ masking layer may subsequently be selectively removed from the substrate 110 and the first nanostructure 120 using an HF-based etchant.

In FIG. 1C and FIG. 1D, the first nanostructures 120, 121 are masked by a same mask 130. However, it is equally possible to mask different first nanostructures with separate masks.

Following forming of the mask 130, a reactive layer 128 is formed on the first nanostructure 120 (FIG. 1E and FIG. 1F). The reactive layer 128 is formed on the regions of the side surfaces 125, 126, 127 exposed by the mask 130. The reactive layer 128 is thus formed along the exposed part of the periphery of the upper surface 122. The exposed part of the periphery of the upper surface 122 is formed by the outer edges of the exposed region of the upper surface 122. As shown, the reactive layer 128 may be formed to be coextensive with the entire exposed periphery of the upper surface 122. As illustrated in FIG. 1F, an upper edge portion of the reactive layer 128 is formed to be flush with the upper surface 122.

The reactive layer 128 may be formed by a layer of molecules. The reactive layer 128 may be formed as a self-assembled monolayer of molecules (SAM), wherein the reactive layer 128 may form on the first nanostructure by chemisorptions of the head group on the first nanostructure 120, in particular on the side surfaces 125, 126, 127 thereof.

Each molecule of the reactive layer 128 may consist of a head group X, a spacer group or backbone group R and a tail group Y. The molecules may accordingly be generally described by the chemical formula X—R—Y. R may denote a carbon backbone or carbon chain. The carbon backbone or chain may comprise straight or cyclic sub-groups which may include saturated and/or unsaturated hydrogen carbons. The carbon backbone or chain may be interrupted by, i.e. include, one or more heteroatoms.

The head group X is selected to bind to the side surfaces 125, 126, 127 formed by the crystal edges of the first TMDC material. Since the upper surface 122 of the first nanostructure 120 is formed by a basal plane of the first TMDC material the head group will not bind to the upper surface 122. The head group may further be selected to not form bonds with the mask 130 or the substrate 110 (i.e. the buffer sub-layer 114).

The tail group Y is selected to form a reactive site for a precursor of the deposition process of the second TMDC material which is to be described below. The tail groups of the reactive layer 128 form the outer surfaces of the reactive layer 128 (i.e. the surfaces facing away from the first nanostructure 120).

A SAM of X—R—Y molecules may be formed on the first nanostructure 120 by submerging the substrate with the first nanostructure 120 formed thereon in a solution of X—R—Y diluted in an organic solvent (e.g. ethanol) for a duration sufficient for allowing formation of a SAM covering the (exposed regions of) side surfaces 125, 126, 127 of the first nanostructure 120. However, it is also possible to form a SAM on the first nanostructure 120 by vapor phase deposition.

Each molecule of the reactive layer 128 may include a thiol head group and a thiol tail group, wherein each molecule may be described by the chemical formula HS—R—SH. Each molecule may alternatively include a thiol head group and a hydroxy or carboxyl tail group, wherein each molecule may be described by the chemical formula HS—R—OH or HS—R—C(O)OH. Each molecule may alternatively include a selenol head group instead of the thiol head group.

The reactive layer 128 may be formed by, prior to forming the dielectric layer 140 as described below, forming an "intermediate" layer or "process" layer of molecules on the first nanostructure 120 along the periphery of the upper surface 122. The process layer may be formed as a SAM of molecules, each molecule including a head group bonding to the first TMDC material and a tail group being inert with respect to the dielectric layer deposition process. Subsequent to forming the dielectric layer 140, the process layer may be converted into the reactive layer 128 by activating the tail group of the molecules of the process layer with respect to a precursor of the deposition process of the second TMDC material.

A process layer of molecules including a thiol head group, a backbone and a cyano-alkane tail group (HS—R—CN) may be converted to a reactive layer 128 of molecules including a thiol head group, a backbone and a hydroxyl tail group (HS—R—OH) or carboxyl tail group (HS—R—C(O) OH). A —CN tail group may be converted into an —OH tail group or a —C(O)OH tail group by hydrolysis using acid or base catalysis. A —CN tail group may also be converted into an —C(O)OH tail group by heat treatment or by UV treatment (for instance using a wavelength of 254 nm). Each molecule may alternatively include a selenol head group instead of the thiol head group.

Alternatively the method may comprise, prior to forming the dielectric layer 140 as described below, forming a "sacrificial" layer or "process" layer of molecules on the first nanostructure 120 along the periphery of the upper surface 122. The process layer may be formed as a (SAM) layer of molecules, each molecule including a head group bonding to the first TMDC material and a tail group being inert with respect to the dielectric layer deposition process. Subsequent to forming the dielectric layer 140, the process layer may be removed wherein a trench is formed between the dielectric layer 140 and the first nanostructure 120, along the periphery of the upper surface 122. The reactive layer 128 may thereafter be formed on the first nanostructure 120 in the trench.

A process layer may be formed by HS—R—Y, wherein Y represents a hydrophobic tail group. The tail group may be a hydrocarbon. A hydrocarbon tail group may be selected as an alkane tail group (for instance —$CH_3$) or as a cycloalkane tail group (for instance —$C_6H_5$). The tail group may be an organofluorine. An organofluorine tail group may be selected as an trifluoromethyl tail group. A tail group may be selected as a cyano-alkane tail group. Each molecule may alternatively include a selenol head group instead of the thiol head group.

A process layer of for instance HS—R—$CH_3$, HS—R—$C_6H_5$, HS—R—$CF_3$ or HS—R—CN may be removed by a plasma-based etch process. The etch process may for instance include subjecting the process layer to an $H_2$ plasma. A process layer may also be removed by heating the process layer to a temperature sufficient for causing desorption of the molecules. A reactive layer 128 of HS—R—SH may thereafter be formed in the trench.

To facilitate deposition of the reactive layer 128 in the trench, the chain length of the R backbone of the molecules of the reactive layer 128 may be selected to be shorter than the chain length of the R backbone of the molecules of the process layer. For instance, for the process layer an alkyl backbone of a chain length between C4 and C18 may be used whereas for the reactive layer 128 an alkyl backbone of a chain length less than the chain length of the process layer may be used.

Figure 1H:
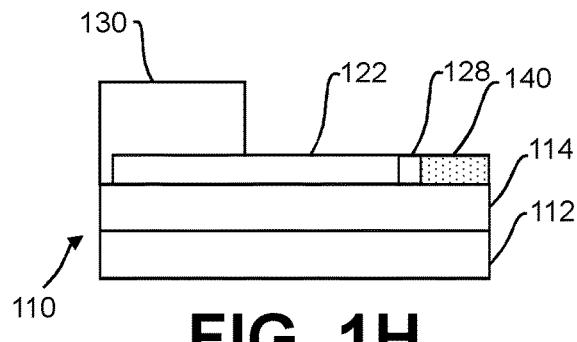
FIG. 1H schematically illustrates a portion of a method for forming a hetero-stack, according to example embodiments.

In FIG. 1G and FIG. 1H, a dielectric layer 140 is formed on the substrate 110. The dielectric layer 140 is formed on a region of the substrate 110 adjacent to the second portion of the first nanostructure 120. The dielectric layer 140 is formed with a thickness such that an upper surface of the dielectric layer 140 becomes flush with (or at least substantially flush with) the upper surface 122 of the first nanostructure 120.

The dielectric layer 140 may be formed by a selective area deposition process. The selective area deposition may be achieved by depositing a high-K dielectric on a dielectric buffer sub-layer 114 in an ALD process using $H_2O$ as a precursor. The high-K dielectric may be $Al_2O_3$, $ZrO_2$ or $HfO_2$.

For instance an $Al_2O_3$ dielectric layer 140 may be selectively deposited on an $Al_2O_3$ buffer sub-layer 114 by ALD using the precursors trimethylaluminum (TMA) and $H_2O$ at a substrate temperature in the range 100-300° C. (e.g. by controlling the temperature of the susceptor of the reactor and/or by controlling the ambient reactor temperature). As another example an $HfO_2$ dielectric layer 140 may be selectively deposited on an $HfO_2$ buffer sub-layer 114 by ALD using the $HfCl_4$ and $H_2O$ at a substrate temperature in the range 100-300° C. In both these examples a duration of the purging between the ALD pulses may be sufficiently long to limit physisorption of the precursors by the first TMDC material.

With reference to FIGS. 1I through 1L, a second nanostructure 150 of a second TMDC material is being formed on the first nanostructure 120. More specifically, the second nanostructure 150 is formed on the second portion of the first nanostructure 120, i.e. the portion of the first nanostructure 120 exposed by the mask 130.

The second TMDC material may be deposited by a CVD process or an ALD process including a transition metal-including precursor and a chalcogenide-including precursor.

Initially, during the deposition process, one of the precursors may react with the reactive layer 128 such that the metal element and/or the chalcogenide element forms a bond with the reactive layer 128 and hence is deposited on the reactive layer 128 along the periphery of the upper surface 122. More specifically, the metal element and/or the chalcogenide element may form a bond with the reactive tail group of the molecules of the reactive layer 128 at the periphery of the upper surface 122. Due to the comparably lower reactivity of the basal plane of the first TMDC material the deposition may be controlled with relative ease such that the precursor is prevented from reacting with the basal plane of the first TMDC material but allowed to react with the tail groups. The precursors may subsequently react with metal elements and/or the chalcogenide elements bonded to the tail groups wherein the second TMDC material may nucleate on the reactive layer 128. Thereby, a "seed structure" of the second TMDC material may gradually form along the periphery of the upper surface 122.

From the second TMDC material nucleated along the periphery of the upper surface 122 (i.e. the "seed structure"), the second TMDC material may grow laterally by the precursors reacting with the crystal edges of the deposited second TMDC material. Due to the comparably lower reactivity of the basal plane of the first TMDC material and the second TMDC material the deposition may be controlled with relative ease such that the second TMDC material is prevented from nucleating directly on the basal plane of the first TMDC material or the basal plane of the already deposited second TMDC material, but allowed to grow on only the edges of the already deposited second TMDC material. Thereby single monolayer growth of the second TMDC material may be achieved.

The deposition process may be continued until a desired coverage of the upper surface 122 by the second TMDC material has been obtained. FIG. 1K and FIG. 1L illustrate a state wherein the second TMDC material has been grown such that the second nanostructure 150 has been formed to completely cover the upper surface 122 on the exposed (i.e. by the mask 130) second portion of the first nanostructure 120. The mask 130 prevents the second TMDC material from being deposited on the masked first portion of the first nanostructure 120.

During the deposition process, the dielectric layer 140 prevents the vertical outer surface portions of the reactive layer 128 (e.g. formed by tail groups) covered by or submerged in the dielectric layer 140 to be exposed to, and hence react with, the precursors. By forming the dielectric layer 140 to be flush with the upper surface 122 of the first nanostructure 120, lateral (outward) growth of the second TMDC material from the vertical outer surface portions of the reactive layer 128 at the level below the upper surface 122 may thereby be prevented.

Figure 1I:
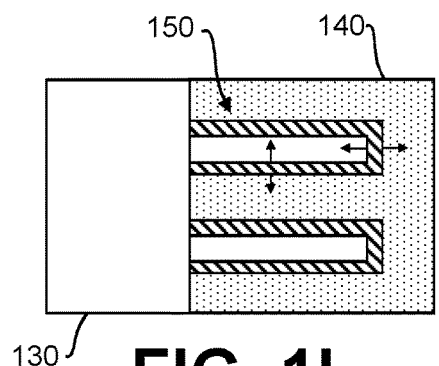
FIG. 1I schematically illustrates a portion of a method for forming a hetero-stack, according to example embodiments.
Figure 1J:
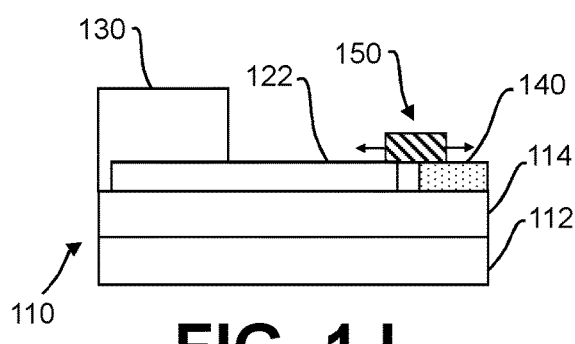
FIG. 1J schematically illustrates a portion of a method for forming a hetero-stack, according to example embodiments.
Figure 1K:
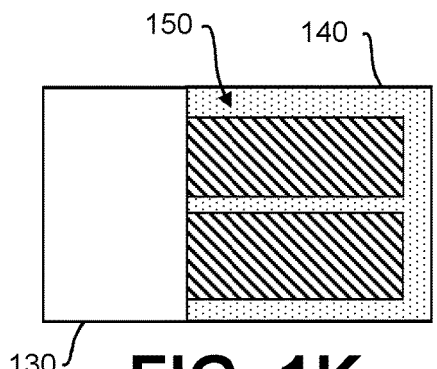
FIG. 1K schematically illustrates a portion of a method for forming a hetero-stack, according to example embodiments.
Figure 1L:
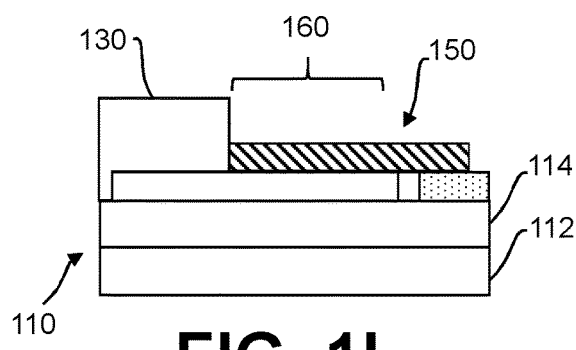
FIG. 1L schematically illustrates a portion of a method for forming a hetero-stack, according to example embodiments.

The lateral growth of the second TMDC material is schematically indicated by the arrows in FIG. 1I and FIG. 1J. As shown, the lateral growth may occur inwardly along the upper surface 122, and outwardly beyond the periphery of the upper surface 122 and the reactive layer 128. Thereby, the second nanostructure 150 is grown laterally to form a first portion overlapping the second portion of the first nanostructure 120 and to form a second portion, protruding above the dielectric layer 140. The second portion of the first nanostructure 120 and the first portion of the second nanostructure 150 thus form an overlapping region 160 of the hetero-stack.

The dielectric layer 140 may accommodate for the height difference between the upper surface of the substrate 110 and the upper surface 122 of the first nanostructure and accordingly support the protruding second portion of the second nanostructure 150.

In FIGS. 1I-1L the second TMDC material is shown to grow perpendicular to the periphery of the upper surface 122, to form a rectangular second nanostructure 150. However in practice, the second nanostructure 150 may deviate from a perfect rectangular shape. The final shape of the second nanostructure 150 may depend inter alia on the dimensions, the shape and/or the crystal structure of the first nanostructure 120 and also on the crystal structure of the second TMDC material. The latter factor may bear increasing weight as the lateral dimensions of the first nanostructure 120 are reduced.

Various combinations of the first and the second TMDC material are possible. The first TMDC material may be anyone of: $WS_2$, $WSe_2$, $WTe_2$, $MoS_2$, $MoSe_2$, $MoTe_2$, $HfS_2$, $HfSe_2$, $HfTe_2$, $ZrS_2$, $ZrSe_2$, or $ZrTe_2$.

The second feature 150 may be formed by growing $WS_2$ on the first nanostructure 120 from the vapor phase precursors $WF_6$ and $H_2S$.

$WS_2$ may be grown in an ALD or CVD process. The CVD process may be pulsed or continuous. The deposition process may be performed at a temperature in the range of 250-450° C. (e.g. by controlling the temperature of the susceptor of the reactor and/or by controlling the ambient reactor temperature). To limit the nucleation density during the initial stage of the deposition process, the precursors may be introduced at a relatively low rate, e.g. 4 mTorr $WF_6$, 60 mTorr $H_2S$, a $H_2S/WF_6$ ratio in the range 0.5 to 100, at a reactor pressure of 2 Torr and a temperature of 450° C. Following initial nucleation on the reactive layer 128 the partial pressures of the precursors may be increased.

$WS_2$ may also be grown in an ALD or CVD process including the precursors $W(CO)_6$ and $H_2S$ or $(C_2H_5)_2S$ at a temperature of about 550° C.

A second feature 150 of $WSe_2$ may be grown in an ALD or CVD process including the precursors $WF_6$ and $H_2Se$, or the precursors $WCl_4$, $WCl_5$, $WCl_6$, or $WO_2Cl_2$ and $H_2Se$.

A second feature 150 of $WTe_2$ may be grown in an ALD or CVD process including the precursors $WF_6$ and $H_2Te$, or the precursors $WCl_4$, $WCl_5$, $WCl_6$, or $WO_2Cl_2$ and $H_2Te$.

In some embodiments, a co-reagent in the example CVD and ALD processes, e.g. $H_2$ (i.e. in molecular form), may also be introduced.

A second feature 150 may alternatively be formed by growing $MoS_2$ on the first nanostructure 120 from the vapor phase precursors $MoCl_5$ and $H_2S$ at a temperature in the range of 500-900° C.

MoS$_2$ may also be grown in a CVD process including the precursors Mo(CO)$_6$ and H$_2$S or (C$_2$H$_5$)$_2$S at a temperature in the range of 350-550° C.

A second feature 150 of MoSe$_2$ may be grown in an ALD or CVD process including the precursors MoCl$_3$, MoCl$_4$, or MoCl$_5$ and H$_2$Se.

A second feature 150 of MoTe$_2$ may be grown in an ALD or CVD process including the precursors MoCl$_3$, MoCl$_4$, or MoCl$_5$ and H$_2$Te.

More generally, a lateral single monolayer growth of these TMDC materials may be achieved by controlling the temperature (e.g. the reactor susceptor temperature and/or the ambient reactor temperature), and/or the partial pressure of the transition metal source precursor, and/or the partial pressure of the chalcogenide precursor, and/or the partial pressure of co-reagents of the deposition process. For instance, by limiting the partial pressure(s) to obtain a comparably low deposition rate the precursor(s) may initially react with the reactive layer 128 (and not the upper surface 122 of the first nanostructure 120) and subsequently with the crystal edges of the deposited second TMDC material (and not with the basal plane formed by the second TMDC material). Partial pressures/deposition rates of the precursors and process temperatures may be determined by trial-and-error by performing deposition at different deposition rates and monitoring whether growth occurs on the basal plane of the second TMDC material.

Figure 1M:
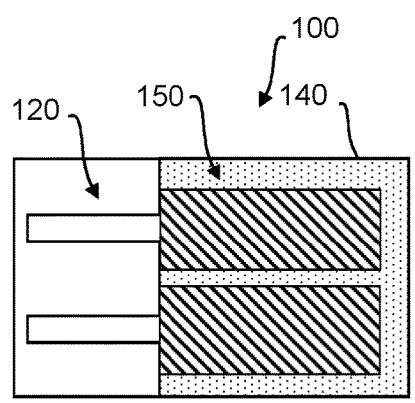
FIG. 1M schematically illustrates a portion of a method for forming a hetero-stack, according to example embodiments.
Figure 1N:
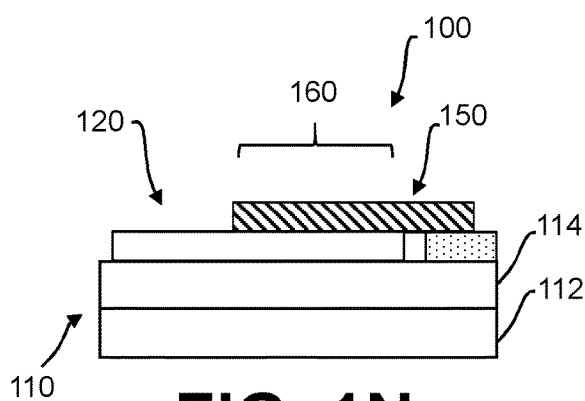
FIG. 1N schematically illustrates a portion of a method for forming a hetero-stack, according to example embodiments.

After the second nanostructure 150 has been formed, the mask 130 may be removed by etching. A mask 130 of SiO$_2$ may be removed using an HF-based etchant. FIG. 1M and FIG. 1N illustrates the process at a stage subsequent to the removal of the mask 130. A device 100 including the hetero-stack of the first nanostructure 120 of the first TMDC material and the second nanostructure 150 of the second TMDC material has been formed. The first portion of the first nanostructure 120 previously covered by the mask 130, and the protruding second portion of the second nanostructure 120 form protruding portions of the hetero-stack, on opposite sides of the overlapping region 160.

As may be seen in FIG. 1N the reactive layer 128 is still present on the portions of the side surfaces 125, 126, 127 of the first nanostructure 120 which were not covered by the mask 130. In this state, the reactive layer 128 may be referred to as a spacer layer 128. By virtue of being bonded to the side surfaces 125, 126, 127 of the first nanostructure 120 the spacer layer 128 may still provide the function of passivating the crystal edges of the first nanostructure 120 as discussed above. An upper edge of the spacer layer 128 is flush with the upper surface of the first nanostructure 120. If the reactive layer/spacer layer 128 is formed by a monolayer of molecules, the tail groups of the molecules of the monolayer of molecules at the upper edge are bonded to the second nanostructure 150.

Figure 1O:
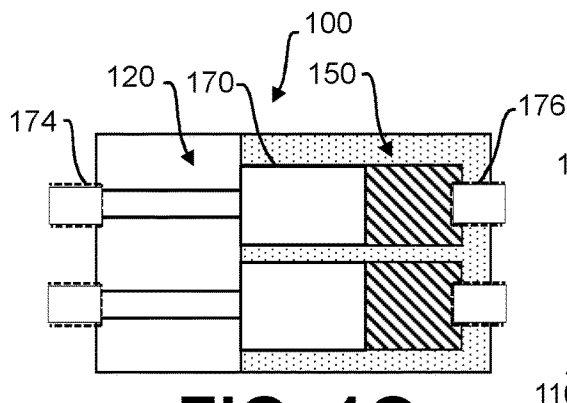
FIG. 1O schematically illustrates a portion of a method for forming a hetero-stack, according to example embodiments.
Figure 1P:
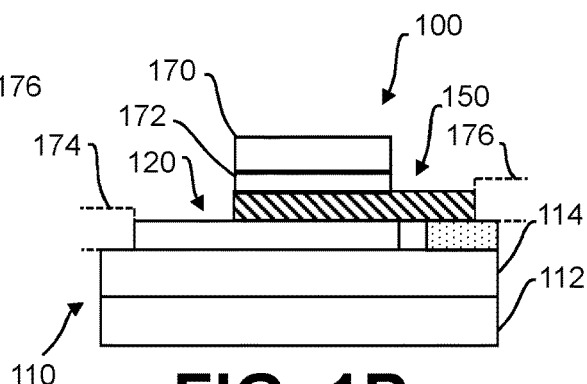
FIG. 1P schematically illustrates a portion of a method for forming a hetero-stack, according to example embodiments.

FIG. 1O and FIG. 1P illustrates the device 100 with a gate stack including a gate conductor 170 and a gate dielectric 172 formed above the overlapping region 160. The gate conductor 170 may be formed by a conducting layer of a metal or highly doped silicon, or by a stack of conducting layers. The gate dielectric 172 may be formed by an oxide layer such as SiO$_2$. The gate dielectric 172 may also be formed by a high-K dielectric such as Al$_2$O$_3$, ZrO$_2$, or HfO$_2$.

An electrode 174 which may be used as a source/drain electrode in a device is formed in contact with the exposed end portion of the first nanostructure 120. Likewise, an electrode 176 which may be as a drain/source electrode is formed in contact with the protruding portion of the second nanostructure 120.

In use of the device 100, charge carriers may be enter/leave the first nanostructure 120 via the electrode 174. Charge carriers may tunnel between the first nanostructure 120 and the second nanostructure 150 via the interface in the overlapping region 160. Charge carriers may enter/leave the second nanostructure 120 via the electrode 176. The tunneling current may be controlled by controlling a voltage applied to the overlapping region 160b via the gate stack.

Different manners of providing the substrate 110 with the first nanostructure 120 are possible. The first nanostructure 120 may be formed in accordance with state of the art techniques including exfoliation from a bulk crystal of the first TMDC material and thereafter be arranged on the substrate 110 by a transfer process. The first nanostructure 120 may also be formed in accordance with start of the art techniques of growing, for instance by molecular beam epitaxy (MBE), a layer of the first TMDC material of a desired thickness on the substrate 110 and thereafter form the first nanostructure 120 by patterning of the layer of the first TMDC material.

Figure 2A:
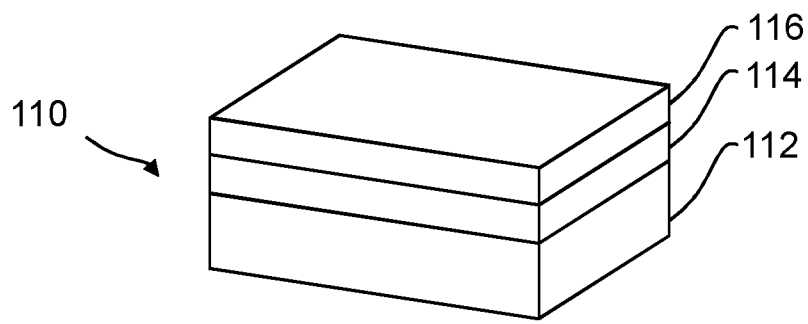
FIG. 2A schematically illustrates a portion of a method for providing a first nanostructure, according to example embodiments.
Figure 2B:
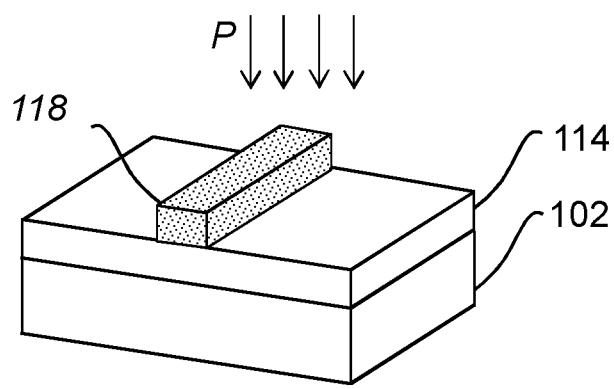
FIG. 2B schematically illustrates a portion of a method for providing a first nanostructure, according to example embodiments.

A further method for forming the first nanostructure 120 will now be described with reference to FIGS. 2A through 2C. A sacrificial material layer 106 is formed on the buffer sub-layer 114 of the substrate 110. The sacrificial material layer 116 is patterned to form a nanostructure of the sacrificial material 118 which is shown in FIG. 2B. The feature 118 may be formed by patterning the sacrificial material layer 116 using a lithography and etching process. The nanostructure 118 is formed with dimensions corresponding to the desired dimensions of the finished first nanostructure 120.

Subsequent to the forming of the nanostructure 118, a deposition process is performed. The deposition process, which will be disclosed in greater detail below, includes subjecting the substrate 110 and the nanostructure 118 to one or more precursors, as schematically indicated by the reference sign P in FIG. 1B. It should be noted this deposition process is different from the deposition process used for depositing the second TMDC material described above. During the deposition process the nanostructure 118 of the sacrificial material is removed from the substrate 110 by forming a volatile reaction product with a precursor of the deposition process. Thereby, the nanostructure 118 of the sacrificial material is replaced by the first TMDC material which is selectively deposited on the surface portion of the substrate 100 which, prior to the deposition process P, was covered by the nanostructure 118 of the sacrificial material.

Figure 2C:
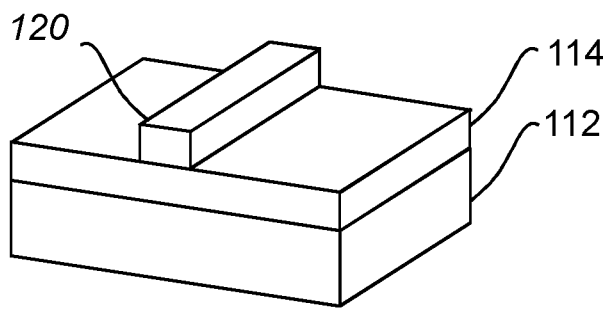
FIG. 2C schematically illustrates a portion of a method for providing a first nanostructure, according to example embodiments.

FIG. 2C shows the result of the deposition process P wherein the nanostructure 118 of the sacrificial material has been replaced by the nanostructure 118 of the first TMDC material.

The sacrificial material forming the nanostructure 118 includes a sacrificial element which acts as a co-reagent with a precursor of the deposition process P. The sacrificial element may function as a reducing agent in the reaction with the precursor. However depending on the type of sacrificial element and precursor it is in principle also possible that the sacrificial element functions as an oxidation agent with the precursor, or forms a co-reagent in a ligand exchange reaction.

Since the deposition process P is such that the formation of the first TMDC material on the substrate 110 involves a reaction between the sacrificial element and the precursor of the deposition process P becomes "self-limiting". In other words, when the nanostructure 118 of the sacrificial material has been removed by reacting with the precursor the formation of the first nanostructure 120 will stop. As a result, the first nanostructure 110 may be formed with dimensions which substantially correspond with the original dimensions of the nanostructure 118. The dimensions of the nanostructure 118 may hence be "transferred" to the feature 110. For instance, a nanostructure 118 having a thickness of 1-10 monolayers of the sacrificial material may be used to form the first nanostructure 120 in the first TMDC material with a corresponding thickness.

A buffer layer 114 formed by a layer of $Al_2O_3$, a layer of $SiO_2$, a layer of $Si_3N_4$, may be inert to the precursors of the deposition process P and protect the underlying sub-layers.

The deposition process P may include exposing the substrate 100 with the nanostructure 118 formed thereon to a first precursor including a transition metal source/element and a second precursor including a chalcogen source/element.

The first precursor may include a compound of a transition metal element and a fluoride or chloride. The second precursor may include a compound of a chalcogen element and hydrogen $H_2$. The sacrificial material may be formed by Si, Al, Ti, TiN, Hf, Sn, Zr, or Ta. Each of these materials have the ability to form a volatile reaction product with chloride- or fluoride-based precursors. The sacrificial material may be an amorphous or crystalline material. The deposition process may be a CVD process or an ALD process.

A first nanostructure 120 of $WS_2$ may be formed by subjecting a nanostructure 118 formed by Si, Al, Ti, TiN, or Hf to a first precursor compound $WF_6$ and a second precursor compound $H_2S$. In the case of a sacrificial material formed by Si, the $WS_2$ material is formed in a two-stage reaction process:

$$2WF_6^{(g)} + 3Si^{(s)} \rightarrow 2W^{(s)} + 3SiF_4^{(g)} \qquad (1)$$

$$W^{(s)} + 2H_2S^{(g)} \rightarrow WS_2^{(s)} + 2H_2^{(g)} \qquad (2)$$

The reaction process may be described in a corresponding manner in the case of a sacrificial material formed by Al, Ti, TiN, or Hf (i.e. by replacing the occurrences of Si in the reaction formulas with Al, Ti, TiN, or Hf). In any case the deposition may be performed at a temperature approximately falling in the range 400-450° C. (e.g. by controlling the susceptor temperature and/or the ambient reactor temperature). Prior to the deposition, the surface of the Si material may be H-passivated.

A first nanostructure 120 of $WS_2$ may also be formed by subjecting a nanostructure 118 formed by Sn, Ti, Zr, Hf, Al, or Ta to a first precursor compound of $WCl_4$, $WCl_5$, $WCl_6$, or $WO_2Cl_2$ and to a second precursor compound $H_2S$.

A first nanostructure 120 of $WSe_2$ may be formed by subjecting a nanostructure 118 formed by Si, Al, Ti, TiN, or Hf to a first precursor compound of $WF_6$ and a second precursor compound of $H_2Se$.

A first nanostructure 120 of $WSe_2$ may also be formed by subjecting a nanostructure 118 formed by Sn, Ti, Zr, Hf, Al, or Ta to a first precursor compound of $WCl_4$, $WCl_5$, $WCl_6$, or $WO_2Cl_2$ and a second precursor compound of $H_2Se$.

A first nanostructure 120 of $WTe_2$ may be formed by subjecting a nanostructure 118 formed by Si, Al, Ti, TiN, or Hf to a first precursor compound of $WF_6$ and a second precursor compound of $H_2Te$.

A first nanostructure 120 of $WTe_2$ may also be formed by subjecting a nanostructure 118 formed by Sn, Ti, Zr, Hf, Al, or Ta to a first precursor compound of $WCl_4$, $WCl_5$, $WCl_6$, or $WO_2Cl_2$ and a second precursor compound of $H_2Te$.

A first nanostructure 120 of $MoS_2$ may be formed by subjecting a nanostructure 118 formed by Sn, Ti, Zr, Hf, Al, or Ta to a first precursor compound of $MoCl_3$, $MoCl_4$, or $MoCl_5$ and to a second precursor compound $H_2S$.

A first nanostructure 120 of $MoSe_2$ may be formed by subjecting a nanostructure 118 formed by Sn, Ti, Zr, Hf, Al, or Ta to a first precursor compound of $MoCl_3$, $MoCl_4$, or $MoCl_5$ and to a second precursor compound $H_2Se$.

A first nanostructure 120 of $MoTe_2$ may be formed by subjecting a nanostructure 118 formed by Sn, Ti, Zr, Hf, Al, or Ta to a first precursor compound of $MoCl_3$, $MoCl_4$, or $MoCl_5$ and to a second precursor compound $H_2Te$.

In the above, methods and devices have been described mainly with reference to a limited number of examples. However, as is readily appreciated by a person skilled in the art, other examples than the ones disclosed above are equally possible within the scope of the disclosure, as defined by the appended claims. For instance, if a "staggered" hetero-stack not is desirable, the dielectric layer 140 may be formed with a thickness exceeding the level of the upper surface 122 of first nanostructure 120. Outward lateral growth of the second TMDC material may thereby be prevented while inward lateral growth may be allowed. Moreover, the mask 130 may even be omitted, wherein a vertical hetero-stack may be formed by laterally growing the second nanostructure 150 to completely cover the entire upper surface 122 of the first nanostructure 120.

What is claimed is:

1. A method for forming a vertical hetero-stack of a first nanostructure and a second nanostructure arranged on an upper surface of the first nanostructure, wherein the first nanostructure is formed by a first transition metal dichalcogenide, TMDC, material and the second nanostructure is formed by a second TMDC material, the method comprising:

providing the first nanostructure on a substrate, wherein the upper surface of the first nanostructure is formed by a basal plane of the first TMDC material;

forming a reactive layer of molecules on the first nanostructure along a periphery of the upper surface; and forming the second nanostructure by a vapor deposition process, wherein the second TMDC material nucleates on the reactive layer of molecules along the periphery and grows laterally therefrom to form the second nanostructure on the upper surface.

2. The method according to claim 1, wherein the second nanostructure is formed directly on the upper surface of the first nanostructure.

3. The method according to claim 1, further comprising, prior to forming the second nanostructure, forming a dielectric layer on the substrate adjacent to the first nanostructure by a dielectric layer deposition process, wherein the dielectric layer is formed with a thickness corresponding to a thickness of the first nanostructure.

4. The method according to claim 1, wherein each molecule of the reactive layer of molecules comprises:

a head group bonding to the first nanostructure; and a tail group forming a reactive site for a precursor of the vapor deposition process.

5. The method according to claim 4, wherein the reactive layer of molecules is formed by a self-assembled monolayer of molecules.

6. The method according to claim 4, wherein each molecule of the reactive layer of molecules comprises:

a thiol head group or a selenol head group; and a thiol tail group, a hydroxy tail group, or a carboxyl tail group.

7. The method according to claim 3, further comprising:
prior to forming the dielectric layer on the substrate adjacent to the first nanostructure, forming a process layer of molecules on the first nanostructure along the periphery of the upper surface, wherein each molecule of the process layer of molecules comprises:
a head group bonding to the first nanostructure; and
a tail group that is inert with respect to the dielectric layer deposition process, and
subsequent to forming the dielectric layer, removing the process layer, wherein a trench is formed between the dielectric layer and the first nanostructure along the periphery of the upper surface; and
forming the reactive layer of molecules in the trench.

8. The method according to claim 7, wherein a length of the molecules of the process layer of molecules is greater than a length of the molecules of the reactive layer of molecules.

9. The method according to claim 3, further comprising:
prior to forming the dielectric layer on the substrate adjacent to the first nanostructure, forming a process layer of molecules on the first nanostructure along the periphery of the upper surface, wherein each molecule of the process layer of molecules comprises
a head group bonding to the first nanostructure; and
a tail group that is inert with respect to the dielectric layer deposition process, and
subsequent to forming the dielectric layer, converting the process layer into the reactive layer of molecules by activating the tail group of the molecules of the process layer with respect to a precursor of the vapor deposition process.

10. The method according to claim 1, further comprising:
forming a mask on the first nanostructure, wherein the mask covers a first portion of the first nanostructure; and
exposing a second portion of the first nanostructure, wherein during the vapor deposition process the mask prevents formation of the second nanostructure on the upper surface of the first portion of the first nanostructure.

11. The method according to claim 10, wherein the reactive layer of molecules is formed along an entire portion of the periphery of the upper surface being exposed by the mask.

12. The method according to claim 10, wherein the second TMDC material, during the vapor deposition process, is grown laterally to form:
a first portion of the second nanostructure overlapping the second portion of the first nanostructure; and
a second portion of the second nanostructure protruding beyond the periphery of the upper surface of the second portion of the first nanostructure.

13. The method according to claim 1, further comprising:
forming a gate stack on an upper surface of the second nanostructure above a region of overlap between the second nanostructure and the first nanostructure;
forming a source or drain electrode in contact with a first portion of the first nanostructure; or
forming a source or drain electrode in contact with the second nanostructure.

14. The method according to claim 1, further comprising:
forming a nanostructure of a sacrificial material on the substrate; and
forming the first nanostructure on the substrate by a first deposition process during which a feature of the sacrificial material is removed from the substrate by forming a volatile reaction product with a precursor of the first deposition process,
wherein the sacrificial material is replaced by the first TMDC material,
wherein the first TMDC material is selectively deposited on surface portions of the substrate to form the first nanostructure of the first TMDC material, and
wherein the surface portions were covered by the feature of the sacrificial material.

15. A device including a vertical hetero-stack of a first TMDC material and a second TMDC material, the device comprising:
a first nanostructure of the first TMDC material,
wherein an upper surface of the first nanostructure is formed by a basal plane of the first TMDC material;
a layer of molecules arranged on at least one side surface of the first nanostructure and extending along a periphery of the upper surface;
a second nanostructure of the second TMDC material arranged on the upper surface of the first nanostructure;
a substrate; and
a dielectric layer arranged on the substrate in a region adjacent to the first nanostructure,
wherein the dielectric layer has a thickness corresponding to a thickness of the first nanostructure,
wherein the second nanostructure is displaced in relation to the first nanostructure to expose a first portion of the first nanostructure and to overlap a second portion of the first nanostructure,
wherein a first portion of the second nanostructure is arranged to overlap the second portion of the first nanostructure, and
wherein a second portion of the second nanostructure is arranged to protrude beyond the periphery of the upper surface of the first nanostructure.

16. A vertical hetero-stack of a first nanostructure and a second nanostructure arranged on an upper surface of the first nanostructure, wherein the first nanostructure is formed by a first transition metal dichalcogenide, TMDC, material and the second nanostructure is formed by a second TMDC material, wherein the vertical hetero-stack is formed by a process that comprises:
providing the first nanostructure on a substrate,
wherein the upper surface of the first nanostructure is formed by a basal plane of the first TMDC material;
forming a reactive layer of molecules on the first nanostructure along a periphery of the upper surface; and
forming the second nanostructure by a vapor deposition process,
wherein the second TMDC material nucleates on the reactive layer of molecules along the periphery and grows laterally therefrom to form the second nanostructure on the upper surface, and
wherein the second nanostructure is formed directly on the upper surface of the first nanostructure.

17. The vertical hetero-stack of claim 16, wherein each molecule of the reactive layer of molecules comprises:
a head group bonding to the first nanostructure; and
a tail group forming a reactive site for a precursor of the vapor deposition process.

18. The vertical hetero-stack of claim 17, wherein the reactive layer of molecules is formed by a self-assembled monolayer of molecules.

19. The device according to claim 15, further comprising:
a gate stack arranged on the first portion of the second nanostructure;

a first electrode arranged in contact with the first portion of the first nanostructure; and a second electrode arranged in contact with the second portion of the second nanostructure.

20. The vertical hetero-stack of claim 17, wherein each molecule of the reactive layer of molecules comprises:

a thiol head group or a selenol head group; and a thiol tail group, a hydroxy tail group, or a carboxyl tail group.

* * * * *